United States Patent [19]  [11]  4,330,708
Meisburger  [45]  May 18, 1982

[54] ELECTRON LENS

[76] Inventor: William D. Meisburger, 1731-B Marshall Ct., Los Altos, Calif. 94022

[21] Appl. No.: 144,596

[22] Filed: Apr. 28, 1980

[51] Int. Cl.³ .......................... G21K 1/08; H01J 29/46
[52] U.S. Cl. .......................... 250/396 ML; 250/396 R; 313/460
[58] Field of Search .............................. 313/460, 462; 250/396 R, 396 ML

[56] References Cited

U.S. PATENT DOCUMENTS 2,369,782 2/1945 Hillier .......................... 250/396 ML
2,408,809 10/1946 Pierce .................................. 313/460
2,740,919 4/1956 Fleming .............................. 313/460

Primary Examiner—Harold A. Dixon
Attorney, Agent, or Firm—Stonebraker, Shepard & Stephens

[57] ABSTRACT

An electron lens having very low spherical aberration. The two electrodes of the lens, in the case of an immersion lens, and the outer electrodes in the case of a three electrode lens, have central openings (in the region of the optical axis) covered by a metallic thin foil or a fine mesh metallic screen curved in the general shape of a hyperbola. Equations and procedures are given for determining the exact shape of the curvature. A procedure is also disclosed for forming the metallic foil or screen section of the electrode to the desired shape.

18 Claims, 8 Drawing Figures

ELECTRON LENS

BACKGROUND OF THE INVENTION

This invention relates to an electron lens, such as is used for example in an electron microscope.

It has long been recognized that electron lenses of the prior art have an undesirable degree of spherical aberration. The book "The World of the Electron Microscope" by Ralph W. G. Wyckoff (Yale University Press, 1958) says on page 27 "The defect which is at present the most important factor in limiting the attainable resolving power is spherical aberration." And later on the same page, "The only way to reduce this aberration is by keeping the opening of the lens small, but with too much aperturing diffraction effects would become damaging."

Fleming U.S. Pat. No. 2,740,919, granted Apr. 3, 1956, attempted to overcome the problem of spherical aberration in electron lenses, but was apparently not successful. Spherical aberration is considered at some length and some mathematical equations are given on pages 69-74 of the book "The Scanning Electron Microscope, Part I, The Instrument" by C. W. Oatley, published by the Cambridge University Press in 1972.

In view of the attention that has been given to the problem of spherical aberration in electron lenses, it can been seen that this is an important problem and that a satisfactory solution is much to be desired.

An object of the present invention is to provide an electron lens in which spherical aberration is eliminated or reduced to an acceptable degree.

Another object of the invention is to provide a practical method or process for making such an electron lens.

DESCRIPTION OF THE PREFERRED EMBODIMENTS

The invention relates particularly to a rotationally symmetrical electrostatic charged particle lens having negligible spherical aberration over a very wide range of entrance angles, and to a method or process for making or producing such a lens.

Figure 1:
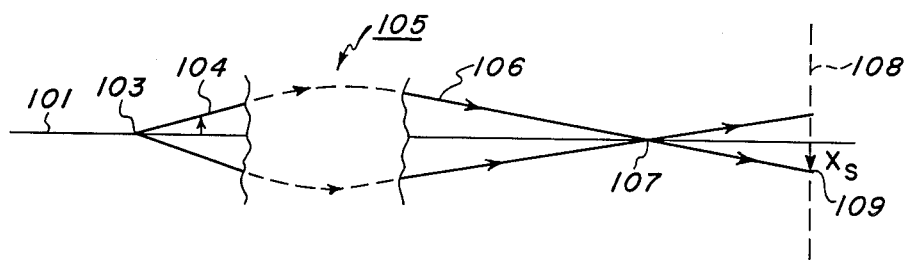
FIG. 1 is a diagram illustrating some of the optical principles involved.

It is known that charged particles emanating from a point source or object on the axis of symmetry, and inclined at an angle $\alpha$ to the axis of a rotationally symmetrical lens, will form a circle having a radius $|x_s|$ in the image plane. For easier understanding, this is illustrated in FIG. 1, where the axis of symmetry is indicated at 101, and the point source or object at 103. Particles from this source move along a path such as 104 to the lens indicated schematically at 105, and thence, with changed direction, along the path 106 which intersects the axis at 107 and continues to intersect the image plane 108 at the point 109. The distance from the axis 101 to the point 109 is the radius $|x_s|$ of the circle above mentioned. Conventionally the sign of the angle $\alpha$ for the top ray is positive and the image dimension $x_s$ of this ray is negative, the reverse being true for the bottom ray illustrated in FIG. 1.

This circle with radius $|x_s|$ is the result of spherical aberration in the lens. The size of the circle, and thus the degree or extent of spherical aberration, is usually expressed by the equation $$x_s = M[C_3\alpha^3 + C_5\alpha^5 + \ldots], \tag{1}$$

where M is the magnification and C with its various subscripts represents the spherical aberration coefficients. The form of the expansion is very general and applies to any lens. If the lens is apertured and the field is static (whether electric or magnetic) then $C_3$ will always be positive.

This means that any combination of charged particle lenses, whether they be electrostatic, magnetic, or a mixture of electrostatic and magnetic lenses, will have more spherical aberration than a single lens. This is very different from glass light optics, where a correction of spherical aberration can be accomplished by combination of lenses designed to produce negative and positive spherical aberration in amounts balancing each other.

The resolving power of an electron microscope may be represented by the expression $$R = C_3^{\frac{1}{4}} \lambda^{\frac{3}{4}}, \tag{2}$$

where R is the resolving power, $C_3$ is the coefficient above mentioned, and $\lambda$ is the electron wavelength. Because of these relationships, the resolving power of an electron microscope is limited to about 2 Angstroms in the case of magnetostatic lenses and about 6 Angstroms for electrostatic lenses. The resolving power could be reduced in principle by using electrons of smaller wavelength and thus higher energy, but the contrast decreases rapidly with decreasing wavelength, thus making the above figures near the best possible.

Another limitation caused by spherical aberration in electron lenses is a limitation of immense practical importance. This is the limitation resulting from the maximum current which can be used in a small probe. This current is represented by the formula $$I = \frac{3\pi^2 \beta d^{8/3}}{16 C_3^{\frac{2}{3}}}, \tag{3}$$

where I represents the current, d is the diameter of the probe, $\beta$ is the brightness of the source, and $C_3$ is the spherical aberration coefficient of the final probe forming lens.

The amount of time it takes to expose an electron resist in the field of electron beam lithography depends on the current. It is possible in principle to manufacture extremely small and complex integrated circuits with microprobes, but the extremely small current available in existing equipment makes this impractical.

Various attempts over the past 30 years to correct or eliminate spherical aberration have included proposals for abandonment of rotational symmetry, introduction of space charge, the use of time varying fields, and covering the apertures with flat electron transparent conductors. In all cases either the aberrations introduced are much worse or the higher order terms such as $C_5$, $C_7$, etc., are found to be large. So far as known at present, no one has demonstrated an electron lens corrected for spherical aberration with optical properties clearly superior to a standard conventional electron lens.

Part of the difficulty appears to result from computation problems. It has not been possible to predict the spherical aberration coefficients $C_3$, $C_5$, $C_7$, etc., for a typical electron lens. This results from the inability to calculate electric or magnetic fields to the necessary accuracy. For example, in a microscope objective, the spherical aberration radius $|x_s|$ is about 2 Angstroms in size, while the lens is of millimeter dimensions. Clearly, a mistake of a few Angstroms will lead to an incorrect result. This implies an overall accuracy of better than one part in $10^7$. Calculating the electric or magnetic field to better than one percent is close to impossible. Approximations can be made for certain lenses that allow one to estimate $C_3$ from incomplete knowledge of the field. Unfortunately, these types of lenses always have a positive value of $C_3$.

One aspect of the present invention deals with the solution of this computational problem. It was only after the computational problem was solved that it was possible to work on another aspect of the invention, the designing of an electron lens with complete or almost complete elimination of spherical aberration. In accordance with the invention it has been possible to produce electron lenses with spherical aberration radii $|x_s|$ that are as much as 100,000 times smaller than normal or conventional electron lenses, over a range of angles much larger than that usually used. For example, it is possible according to this invention to produce satisfactory lenses, well corrected for spherical aberration, having useful angles of 20 degrees, as compared with conventional electron lenses in which the useful angle is normally limited to about 0.5 degree, and with much greater spherical aberration than the lens of the present invention. The use of a lens according to the present invention as an electron microscope objective would give a resolving power below one Angstrom with greatly improved contrast and much less damage to the specimen being observed. If one of the improved lenses of the present invention is used in a probe forming machine, currents of as much as 1,000 times the currents now possible could be used.

All corrected lenses developed according to the present invention have the following properties in common:

1. They are electrostatic and rotationally symmetrical.
2. The entrance and exit electrodes have inner edges which are smooth curves that are electrically continuous through the axis and are substantially particle transparent at and close to the axis.
3. The curved surfaces of the lenses must be precisely shaped to fit complicated surface equations to extreme accuracy.

A technique for designing a lens according to the present invention will now be described.

The electrostatic potential $\Phi$ in a charge free region satisfies Laplaces's equation $$\nabla^2 \phi = 0.$$

Rather than trying to satisfy this equation approximately for some particular set of boundary conditions, the preferred technique according to the present invention is to represent the potential as a linear combination of exact solutions of Laplace's equation and use boundary conditions given by the potential itself. A particular set of expansion coefficients is picked as an initial guess of the correct design. The electric field is confined along the symmetry axis between two equipotentials whose positions are now picked. An object position and an image position are picked and a trajectory of very small slope is calculated to find the image plane. If this does not coincide with the picked position, the lens potential is multiplied by some factor to bring them into coincidence. The magnification is calculated, and the spherical aberration $x_s$ is determined for a number of different angles. The "spherical aberration function" $F_i$ for the $i^{th}$ angle is defined by the equation $$F_i = \frac{x_s}{M a_i^3}. \tag{5}$$

The sum of the squares of the spherical aberration function is designated by S, and is given by the equation $$S = \sum_{i=1}^{NA} F_i^2, \tag{6}$$

where NA is the total number of angles used. S is the function which is to be minimized as much as possible. This is done, according to the present invention, by making small changes in the potential expansion coefficients, in the position of the object or of the image, or a number of other possible variables, and then recalculating the value of S. From this information a new set of coefficients and variables is chosen that gives a smaller value of S. This process is repeated until no more improvement can be obtained by any reasonable amount of further calculation. Because one is looking for small changes in quantities that are already very small ($x_s$) the accuracy requirements are severe. Overall calculation accuracy must usually be between one part in $10^7$ and one part in $10^{10}$.

The electrostatic potential in a charge density free rotationally symmetrical region can be expressed as $$\phi(\rho,z) = \sum_{n=0}^{\infty} \left\{ A_n (\rho^2 + z^2)^{n/2} P_n\left(\frac{z}{\sqrt{\rho^2 + z^2}}\right) + \sum_{i=1}^{N_n} B_{in}[\rho^2 + (z - z_{in})^2]^{-(n+1)/2} P_n\left(\frac{z - z_{in}}{\sqrt{\rho^2 + (z - z_{in})^2}}\right) \right\}. \tag{7}$$

In the above expression, $\pi$ and $z$ are cylindrical coordinates, $P_n$ is the $n^{th}$ Legendre polynomial, and $z_{in}$ is the position of the $i^{th}$ multipole of $(n+1)^{th}$ order. These functions are the known spherical zonal harmonics written in cylindrical rather than spherical coordinates. Any set of the coefficients $\{A_n, B_{in}, z_{in}\}$ will produce a potential that satisfies Laplace's equation. $N_n$ is the number of multipoles used of $(n+1)^{th}$ order.

The only constraint now required is that the set $\{z_{in}\}$ lie outside the lens region.

The equations of the equipotentials that confine the field in the z direction are the following:

$$\phi(\pi, z) = \phi(0, z_L), \quad (8)$$

$$\phi(\pi, z) = \phi(0, z_R). \quad (9)$$

Figure 2:
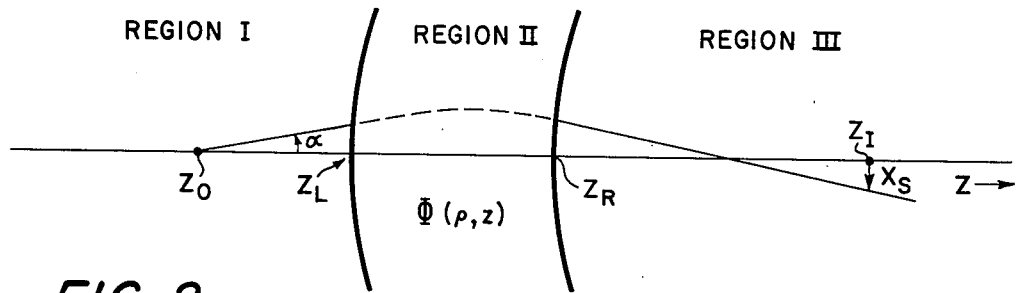
FIG. 2 is a schematic diagram illustrating the path of a particle through the lens.

In these equations, referring now to FIG. 2 of the drawings, $z_L$ and $z_R$ are the z intersection positions of the two equipotentials, as illustrated in FIG. 2. This view is intended as a schematic illustration to aid in quick understanding of the equations just mentioned, and the meaning of the other parts of FIG. 2 not specifically referred to herein will be obvious to those skilled in the art.

Trajectory calculation will now be discussed. The relativistic trajectory equation for a point charge with no angular momentum is given by either of the following two equations:

$$\frac{d^2\rho}{dz^2}\left[\frac{(E-q\phi)(\gamma+1)}{\gamma}\right] = \left[1+\left(\frac{d\rho}{dz}\right)^2\right]\left[q\frac{d\rho}{dz}\frac{\partial\phi}{\partial z} - q\frac{\partial\phi}{\partial\rho}\right] \quad (10)$$

$$\frac{d^2z}{d\rho^2}\left[\frac{(E-q\phi)(\gamma+1)}{\gamma}\right] = \left[1+\left(\frac{dz}{d\rho}\right)^2\right]\left[q\frac{dz}{d\rho}\frac{\partial\phi}{\partial\rho} - q\frac{\partial\phi}{\partial z}\right] \quad (11)$$

In these equations, $$\gamma = \frac{E - q\phi}{mc^2} + 1 \quad (12)$$

and E represents the total energy expressed by $$E = mc^2\left[\frac{1}{\sqrt{1-\frac{v^2}{c^2}}} - 1\right] + q\phi. \quad (13)$$

In the foregoing equation, m is the rest mass of the particle, q is the charge of the particle, c is the speed of light in vacuum, and v is the speed of the particle.

Equation (10) is usually sufficient for calculating the trajectory. However, if the lens is a mirror, the path must be broken into sections along which either $\pi$ is a single valued function of z or z is a single valued function of $\pi$. In the latter case, equation (11) is used.

It is convenient to chose the units of electron volts for E and $mc^2$. $\Phi$ will then be in volts, and q will be in electron charges. The quantities $\pi$ and z are dimensionless, by which is meant that they do not represent any particular linear dimension, but may be expressed in terms of centimeters, inches, or any convenient units of measurement. As will be noted further below, it is best to think of these quantities $\pi$ and z as merely "units" broadly, rather than any specific kind of measurement units, and the desired values can be given to these units at any convenient time.

If the object position is in the region designated as region I in FIG. 2, and the velocity trajectory is inclined at an angle $\alpha$ to the z axis as seen in FIG. 2, then the particle will intersect the $z_L$ equipotential at the position $\pi_L^*$, $z_L^*$. This point of intersection is found by solving the equation $$\phi(\pi(z), z) - \phi(0, z_L) = f(z) = 0, \quad (14)$$

where $$\pi(z) = \text{Tan}(\alpha)[z - z_o]. \quad (15)$$

These are solved by using "Newton's method."

If the initial kinetic energy of the particle is $E_{KI}$, then $$E = E_{KI} + q\phi(0, z_L). \quad (16)$$

Equation (10) can be numerically integrated using the initial conditions $$z = z_L^*, \rho = \rho_L^*, \frac{d\rho}{dz} = \text{Tan}(\alpha).$$

Assuming that the lens is not a mirror, the particle will intersect the $z_R$ equipotential at the position $\pi_R^*$, $z_R^*$. This point is found by solving the equation $$\phi(\pi(z), z) - \phi(0, z_R) = f(z) = 0, \quad (18)$$

where $\pi(z)$ is given by the trajectory equation (10). "Newton's method" is again used.

The trajectory equation for the trajectory in region III of FIG. 2 is given by the equation $$\rho(z) = \frac{d\rho}{dz}\bigg|_{z_R^*}(z - z_R^*) + \rho_R^*. \quad (19)$$

Minimization procedure

To determine the parameters for a lens with minimum spherical aberration, a trial set of potential expansion coefficients $\{A_n, B_{in}, z_{in}\}$ are picked; the z positions $z_O$, $z_L$, $z_R$, and $z_I$ are picked, and the initial kinetic energy $E_{KI}$ are picked. A small angle trajectory is calculated. For this purpose, an angle of $10^{-10}$ radians is usually sufficient. The potential is adjusted to place the z intersection point at $z_I$. A set of angles $\{\alpha_i\}$ is picked, and the spherical aberration at each angle is calculated from the equation $$x_s = \frac{d\rho}{dz}\bigg|_{z_R^*}(z_I - z_R^*) + \rho_R^*. \quad (20)$$

Equation (5) is used to obtain the spherical aberration function, and finally S is obtained from equation (6). S is a function of $\{A_n, B_{in}, z_{in}\}$, $z_O$, $z_L$, $z_R$, $z_I$, and $E_{KI}$. $A_o$ is not included in this set. Not all of these can be varied independently. It is necessary that at least one of the potential coefficients $\{A_n, B_{in}\}$, and two in the set $z_O$, $z_L$, $z_R$, and $z_I$ be held fixed. Assuming that the set of parameters to be varied make up the set $\{B_k\}$, then it is required that $$\frac{\partial s}{\partial B_k} = 0, k = 1,2,\ldots NV, \tag{21}$$

where NV is the number of variables. This is solved by the technique of "damped least squares" which is a known technique used in the design of glass lens systems.

Then the following set of linear equations must be solved for the $\{\Delta B_l\}$.

$$-\sum_{i=1}^{NA} F_i \frac{\partial F_i}{\partial B_k} = \sum_{l=1}^{NV} \Delta B_l \sum_{i=1}^{NA} \frac{\partial F_i}{\partial B_l} \frac{\partial F_i}{\partial B_k} [1 + P\delta_{lk}], \tag{22}$$

$$k = 1,2,\ldots NV,$$

$\delta_{lk}$ is the "Kronecker delta" and P is the "damping factor." P is chosen to yield the most rapid convergence. All of the partial derivatives in equation (22) must be calculated numerically. I have found that a "central difference" works well, but the size of the variation needed to give a derivative of a particular accuracy for each variable must be found by numerical experimentation. The new set of variables is given by $\{B_k + \Delta B_k\}$ and the process is repeated until the equation (21) is sufficiently satisfied.

The parameters for an immersion electron lens designed by the procedure explained above are given in Table I. The performance of this lens at a number of different angles is shown in Table II. The angles marked with an asterisk are those which were used in the minimization. Similarly, the parameters for a symmetrical unipotential electron lens are given in Table III, and the performance of that lens is shown in Table IV. Again in Table IV, the angles marked with asterisks are those used in the minimization.

The use of the word "units" in the tables is a reminder that $\pi$ and z are dimensionless; that is, these units may represent centimeters, or inches, or any other units desired, so long as the same units are used throughout the tables for any one lens.

All of the potential expansion coefficients not listed in Table I or Table III are equal to zero.

TABLE I (Immersion Electron Lens Parameters)

$z_O = -2.02329139$ "units"   $z_L = -.5$ "units"
$z_I = 20$ "units"   $z_R = .5$ "units"

| n | $A_n$ in volts per ("unit")$^n$ |
|---|---|
| 0 | $7.87648355 \times 10^3$ |
| 1 | $2.24637513 \times 10^4$ |
| 2 | $1.3422124 \times 10^4$ |
| 3 | 2.4904 |
| 4 | −2.4794 |
| 5 | $-1.6874 \times 10^1$ |
| 6 | −9.0515 |
| 7 | 5.6826 |
| 8 | $1.3035 \times 10^1$ |
| 9 | $3.3451 \times 10^1$ |
| 10 | $-9.318 \times 10^{-2}$ |
| 11 | −1.697 |
| 12 | $5.069 \times 10^{-2}$ |
| 13 | 1.564 |
| 14 | −2.784 |
| 15 | $-9.435 \times 10^{-1}$ |

$E_{KI} = 25 \times 10^3$ electron volts
$\phi(0, z_L) = 0$ volts   $\phi(0, z_R) = 7.51908605 \times 10^4$ volts

TABLE II (Immersion Electron Lens Performance)
$M = -5.14194920$

| $\alpha$ in degrees | $F_i$ in "units" |
|---|---|
| $5 \times 10^{-3}$ | $-1.1 \times 10^{-7}$ |
| $5 \times 10^{-2}$* | $-1.18 \times 10^{-7}$ |
| $1 \times 10^{-1}$ | $-1.18 \times 10^{-7}$ |
| $5 \times 10^{-1}$* | $-1.23 \times 10^{-7}$ |
| 1* | $-1.37 \times 10^{-7}$ |
| 2 | $-1.91 \times 10^{-7}$ |
| 3* | $-2.69 \times 10^{-7}$ |
| 4 | $-3.56 \times 10^{-7}$ |
| 5 | $-4.28 \times 10^{-7}$ |
| 6* | $-4.62 \times 10^{-7}$ |
| 7 | $-4.39 \times 10^{-7}$ |
| 8 | $-3.49 \times 10^{-7}$ |
| 10* | $-3.42 \times 10^{-8}$ |
| 13* | $9.16 \times 10^{-8}$ |
| 14 | $-8.71 \times 10^{-8}$ |
| 15* | $-2.91 \times 10^{-7}$ |
| 17 | $-2.55 \times 10^{-7}$ |
| 18* | $3.36 \times 10^{-8}$ |
| 19 | $1.62 \times 10^{-7}$ |
| 20 | $-5.22 \times 10^{-8}$ |

TABLE III (Symmetric Unipotential Election Lens Parameters)

$z_O = -.8$ "units"   $z_L = -.5$ "units"
$z_I = 10$ "units"   $z_R = .5$ "units"

| n | $A_n$ in volts per ("unit")$^n$ |
|---|---|
| 0 | $-5.80210694 \times 10^1$ |
| 2 | $3.80791093 \times 10^4$ |

| $z_{io}$ in "units" | $B_{io}$ in volts-"units" |
|---|---|
| ±.5935 | $4.1656135 \times 10^2$ |
| ±.604 | $-7.86681940 \times 10^2$ |
| ±.6169 | $2.0430730 \times 10^3$ |
| ±.6336 | $-2.25984 \times 10^3$ |
| ±.6558 | $2.83345 \times 10^3$ |
| ±.6870 | $-1.38254 \times 10^3$ |
| ±.73375 | $2.13286 \times 10^3$ |
| ±.8117 | $7.05492 \times 10^2$ |
| ±.9675 | $5.52437 \times 10^3$ |
| ±1.435 | $6.4477 \times 10^3$ |

$E_{KI} = 70 \times 10^3$ electron volts
$\phi(0, z_L) = 0$ volts   $\phi(0, z_R) = 0$ volts

TABLE IV (Symmetric Unipotential Electron Lens Performance)
$M = -9.18211043$

| $\alpha$ in degrees | $F_i$ in "units" |
|---|---|
| $1 \times 10^{-2}$ | $3.33 \times 10^{-5}$ |
| 1* | $1.093 \times 10^{-5}$ |
| 2 | $-4.11 \times 10^{-6}$ |
| 3* | $5.04 \times 10^{-6}$ |
| 4 | $1.760 \times 10^{-5}$ |
| 5* | $5.16 \times 10^{-6}$ |
| 6 | $-1.203 \times 10^{-5}$ |
| 7* | $-2.22 \times 10^{-6}$ |
| 8 | $1.640 \times 10^{-5}$ |
| 9* | $9.12 \times 10^{-6}$ |
| 10 | $-1.230 \times 10^{-5}$ |
| 11* | $-1.186 \times 10^{-5}$ |
| 12 | $1.000 \times 10^{-5}$ |
| 13* | $1.899 \times 10^{-5}$ |
| 14 | $6.4 \times 10^{-7}$ |
| 15* | $-1.931 \times 10^{-5}$ |
| 16 | $-1.202 \times 10^{-5}$ |
| 17* | $1.226 \times 10^{-5}$ |
| 18* | $1.230 \times 10^{-5}$ |
| 19* | $-2.170 \times 10^{-5}$ |
| 20* | $8.30 \times 10^{-6}$ |

Figure 3:
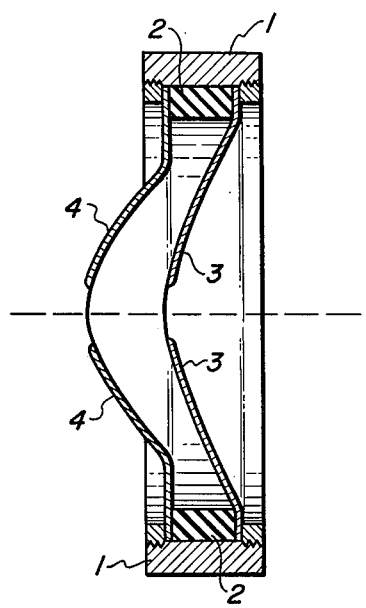
FIG. 3 is a diametrical section taken axially through an electron lens according to one embodiment of the invention.

Referring now to FIG. 3 of the drawings, this shows, in axial diametrical section, a corrected immersion lens according to a preferred embodiment of the invention. It comprises a lens cell or mount 1 and a spacer 2 both made of insulating material, and two electrodes 3 and 4 separated from each other at their edges by the spacer and held in position against the spacer by conventional retaining rings.

Figures 4, 5:
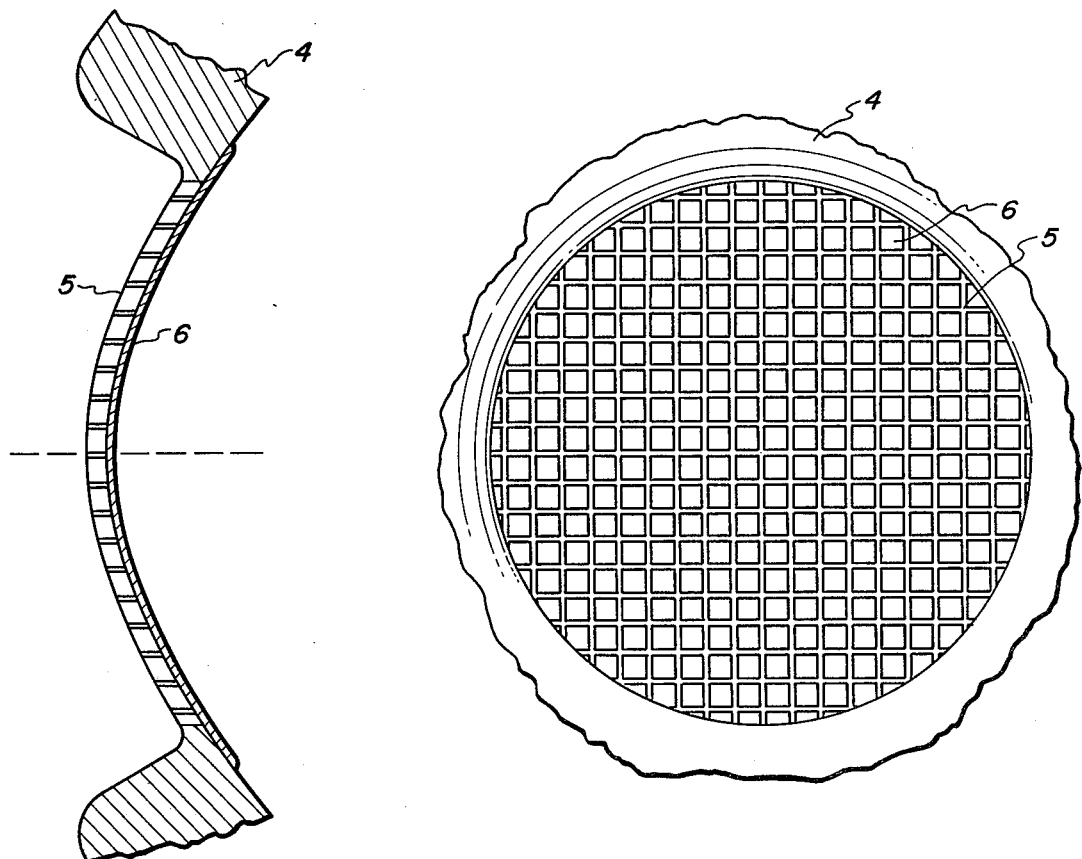
FIG. 4 is a fragmentary view of a portion of the lens shown in FIG. 3, on a much larger scale.
FIG. 5 is a face view of the structure shown in FIG. 4.

These electrodes 3 and 4 are of electrically conducting material. The central region of each electrode, shown on an enlarged scale in FIGS. 4 and 5, is made of a very fine mesh metallic screen 5 preferably with a thin layer 6 of material which is electrically conducting and which is substantially transparent to passage of electrons, although this layer 6 may be omitted if desired. The electrode 4 and the screen 5 and the film 6, when such film is used, are all electrically continuous.

It will be noted particularly that the central portion of the electrode, at and near the optical axis, is not flat or in a plane, but on the contrary is curved appreciably, this being a characteristic feature of the invention. The curvature is approximately but not exactly in the shape of a hyperbola. It is this shape which results in the reduction of spherical aberration in the lens. The exact shape of the curve is determined by the calculations above explained.

Figure 6:
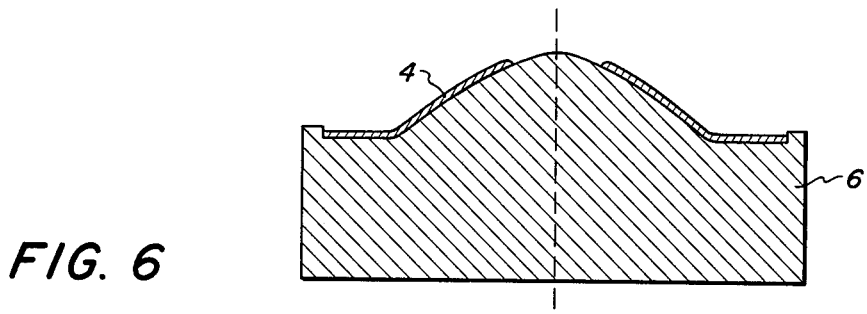
FIG. 6 is an axial diametrical section through one form of mandrel used in forming a portion of the lens according to the present invention.

FIG. 6 is an axial diametrical section through a mandrel useful in forming the electrode. The mandrel, shown at 61, is shaped to the desired curvature, and then the curved portion of the electrode 4 and its screen portion 5 are formed upon this mandrel. This will be further described below, in connection with FIG. 8. Of course a separate mandrel, with a somewhat different curvature, is used for forming the electrode 3 and its curved screen portion.

Figure 7:
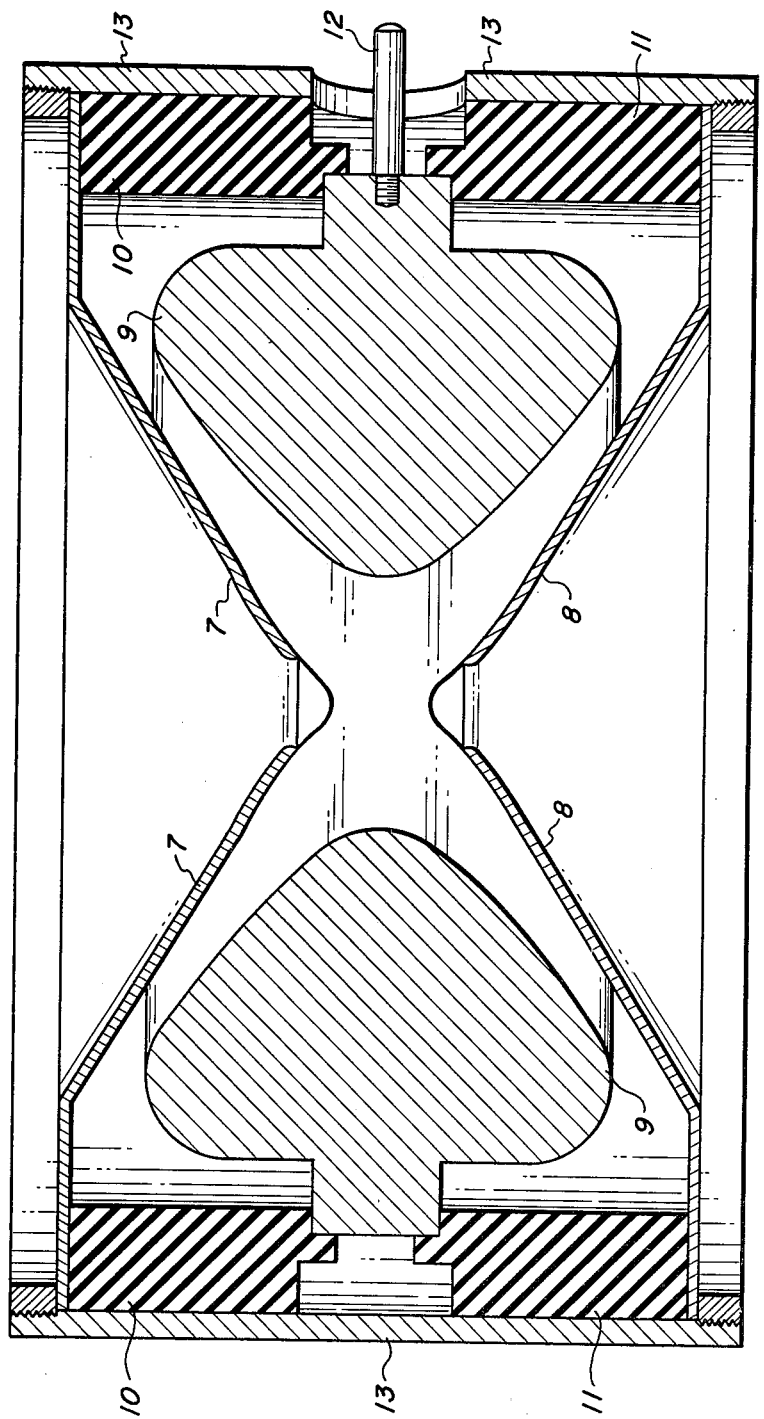
FIG. 7 is an axial section taken diametrically through a corrected lens according to another embodiment of the invention.

Reference is now made to FIG. 7, illustrating a preferred form of electron lens. This lens has two electrodes 7 and 8 with curved central portions separated from each other and with their convex sides toward each other. In the space between these electrodes 7 and 8 there is another electrode 9 in the form of an annular ring. The electrodes are separated from each other by separators 10 and 11 of insulating material, held within the housing or cell 13 which may be of metal. A conducting connector 12 extends from the middle electrode 9 radially outward through an opening in the housing 13, to a suitable source of potential. The housing 13 and the electrodes 7 and 8 which normally are electrically connected to the housing 13 are at a different potential, preferably grounded.

Reverting now to the immersion lens shown in FIG. 3, the shape of the interior surface of the electrodes (that is, the surfaces toward the spacer (2) is given by the equipotential equation (8) for electrode 4 and equation (9) for electrode 3, using the parameters listed in Table I, with the scale of the one "unit" representing one centimeter. It is only necessary to follow these equations for $\pi$ equal to or less than about 2 centimeters.

This leads to a deviation in the actual performance from that of the mathematical model that is less than the deviation caused by machining inaccuracy. The best machining accuracy obtainable at present for cutting complicated rotationally symmetrical curves is with a computer operated lathe that utilizes laser interferometric techniques to determine the position of a diamond cutting tool. The machining accuracy is plus or minus 5000 Angstroms.

Figure 8:
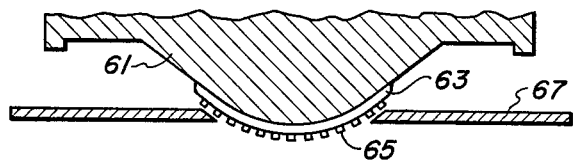
FIG. 8 is a schematic view illustrating part of the method of manufacturing the lens.

A preferred method of forming an electrode to the desired shape according to the present invention will now be described. A mandrel, such as shown at 61 in FIG. 6, is formed with a surface corresponding in shape to the inner surface of the electrode to be produced. The mandrel may be produced by machining with a computer operated lathe as above mentioned. A central curved region of the mandrel, throughout an area as large as or larger than the area of the central screen shown especially in FIGS. 4 and 5 (the screen also being indicated by the thin line portions of FIGS. 3 and 7) is coated with a positive photoresist, as shown at 63 in FIG. 8. An evaporation mask is made by deforming a piece of fine mesh metal screen (500 or more openings per inch) of an area slightly larger than the screen area to be formed on the electrode as shown in FIGS. 3, 4, 5, and 7, this evaporation mask screen being shaped to correspond approximately with the curvature of the central region of the mandrel, which can be done by pressing the screen between a positive and a negative curved form that corresponds approximately to the shape of the central curved region of the mandrel. The curved screen is then placed on the mandrel over the photoresist, as indicated schematically at 65 in FIG. 8. Then a shield 67 with a circular central opening corresponding in diameter to the diameter of the desired final screen (as in FIG. 5, for example) is placed over the masking screen 65 as illustrated in FIG. 8, and serves to hold the masking screen 65 in place.

This assembly is then placed in a vacuum chamber, and a thin film of aluminum is evaporated onto the photoresist 63 through the openings in the masking screen 65. This is continued until the aluminum film is deposed to a thickness of about 1 micron.

The assembly is removed from the vacuum chamber, the shield 67 and masking screen 65 are removed from the photoresist, and the mandrel with the photoresist coating on it is exposed to a near parallel beam of light. The aluminum is now chemically removed, as for example by a sodium hydroxide solution. The photoresist is now developed in the conventional way, to yield columns projecting up from the central region of the mandrel, corresponding to the holes in the curved screen 65. Copper is now deposited into the region corresponding to the desired screen area and surrounding area of the electrode which is being constructed, by the well known technique of electroforming. Copper is prevented from becoming deposited on the rest of the mandrel by electrically insulating it from the plating bath. The plating will produce a screen structure in the central region and a solid structure elsewhere.

The plating is halted when the thickness of the screen structure is approximately equal to the thickness of the columns of photoresist material. If this is not thick enough to provide adequate mechanical support (preferably about 25 microns in thickness) the mandrel may be coated with another layer of photoresist and the process may be repeated, taking care to line up the curved evaporation mask screen with the already deposited screen. This may be repeated as often as necessary to obtain a final copper screen thickness of any desired extent. The reason it may be necessary to do this deposit procedure more than once, is that the maximum thickness of the photoresist depends upon the spatial resolution needed to reproduce the screen, and on the particular brand of photoresist material which is used.

It is sometimes useful to use a coarser evaporation screen mask for second and subsequent layers, to reduce the number of layers needed. When an adequate thickness in the center has been obtained, the central region is coated with an insulating material (more photoresist material works well for this purpose) to cover the screen area, and the electroforming is continued until the rest of the electrode is sufficiently thick, for example about 1 millimeter in thickness. The electrode is now stripped from the mandrel.

If it is desired to have a layer of conducting material extend across the screen, such as shown at 6 in FIG. 4, this may be done by evaporating onto the inner surface of the electrode, in a vacuum chamber, a thin layer of electrical conducting material which is sufficiently transparent to the charged particles. Many conductive materials are suitable for this purpose, and the thickness to be deposited will depend on the material. Thicknesses of various materials which will permit sufficient passage of charged particles are well known in the art. As examples, carbon or aluminum or beryllium may be used, and for these materials, a thickness of 50 to 100 Angstroms is satisfactory for purposes of the present invention. The insulating material and the remaining photoresist are now dissolved from the central region, leaving the thin layer of deposited electrically conducting material which, as above stated, is transparent to the passage of the electrons or other charged particles.

Referring now to the unipotential lens illustrated schematically in FIG. 7, the shape of the interior surfaces of the electrodes 7 and 8 (that is, the surfaces facing toward each other) is given by the equipotential equations (8) or (9), with the parameters listed in Table 3, and the scale of one "unit" being equal to 2 centimeters. Electrodes 7 and 8 are identical with each other, but are reversed so that their convex sides face each other as illustrated.

The shape of the middle electrode 9 in FIG. 7 is given by the equipotential equation $$\phi(\pi, z) = -70 \times 10^3 \text{ volts.} \qquad (23)$$

The choice of this particular equipotential is for convenience, since the source of electrons would operate at the same voltage. It is only necessary to follow these equations for $\pi \leq 6$ centimeters for the same reason as stated earlier for the immersion lens. The electrodes 7 and 8 may be constructed by the same technique above described for the construction of the electrodes 3 and 4.

Using the manufacturing techniques according to the present invention for the electrodes, and with a machining accuracy within a tolerance of ±5000 Angstroms, the actual performance of these lenses will agree closely with the predicted performance stated in Tables II and IV.

In addition to the prior art references given near the beginning of this specification, attention is called to the published article by Albert Septier on "The Struggle to Overcome Spherical Aberration in Electron Optics," appearing in "Advances in Optical and Electron Microscopy," volume I, edited by R. Barer and V. E. Cosslett, published by the Academic Press, London, England, in 1966. Attention is also called to the book "Focusing of Charged Particles," volume I, edited by Albert Septier, published by the Academic Press in 1967, which contains many of the equations which are used in the above disclosure of the present invention, as well as additional equations.

In most or perhaps all cases, the various equations used in connection with the present invention must be solved by using a computer.

In various places in the foregoing disclosure, an "electron lens" has been mentioned, and these words have been used as the title of the invention. This is merely for convenience and brevity of description. Actually, the lens of the present invention would be more appropriately called a "charged particle lens," since it is equally useful as a lens for all kinds of charged particles, such as protons and ions as well as electrons.

What is claimed is:

1. A charged particle lens comprising two electrodes aligned with each other on an optical axis, a portion of each electrode in the region of said optical axis being substantially transparent to passage of charged particles approximately along said optical axis, characterized by the fact that each of said electrodes has a surface which, at least in the region of said optical axis, is in the shape of a smooth curve the shape of which is determined by the equations (7), (8), and (9) in the foregoing specification with the parameters in Table I in the foregoing specification and further characterized by the fact that the surface having said smooth curve has substantially uniform continuous electrical conductivity at least in the region of said optical axis.

2. The invention defined in claim 1, wherein a portion of said smooth curve surface which is transparent to passage of charged particles is formed at least in part by a thin continuous layer of electrical conducting material.

3. The invention defined in claim 2, wherein said continuous layer of electrical conducting material is of material chosen from the group consisting of carbon, aluminum, and beryllium, and has a thickness in the range of 50 to 100 Angstroms.

4. The invention defined in claim 1, wherein a portion of said smooth curve surface which is transparent to passage of charged particles is formed at least in part by a fine mesh metallic screen.

5. The invention defined in claim 1, wherein a portion of said smooth curve surface which is transparent to passage of charged particles is formed at least in part by a thin continuous layer of electrical conducting material overlying and supported by a fine mesh metallic screen.

6. A charged particle lens comprising three electrodes aligned with each other on an optical axis, a portion of each electrode in the region of said optical axis being substantially transparent to passage of charged particles approximately along said optical axis, characterized by the fact that each of said electrodes has a surface which, at least in the region of said optical axis, is in the shape of a smooth curve the shape of which is determined by the equations (7), (8), and (9) in the foregoing specification with the parameters in Table III in the foregoing specification, and further characterized by the fact that the surface having said smooth curve has substantially uniform continuous electrical conductivity at least in the region of said optical axis.

7. The invention defined in claim 6, wherein a portion of said smooth curve surface which is transparent to passage of charged particles is formed at least in part by a thin continuous layer of electrical conducting material.

8. The invention defined in claim 6, wherein a portion of said smooth curve surface which is transparent to passage of charged particles is formed at least in part by a fine mesh metallic screen.

9. The invention defined in claim 6, wherein a portion of said smooth curve surface which is transparent to passage of charged particles is formed at least in part by a thin continuous layer of electrical conducting material overlying and supported by a fine mesh metallic screen.

10. The invention defined in claim 7, wherein said continuous layer of electrical conducting material is of material chosen from the group consisting of carbon, aluminum, and beryllium, and has a thickness in the range of 50 to 100 Angstroms.

11. The method of preparing an electrode for a charged particle lens which comprises the steps of preparing a mandrel with a central portion having a curved shape corresponding to the desired shape of the central portion of an electrode to be prepared, coating said portion of the mandrel with a photoresist, preparing an evaporation mask of a fine mesh metal screen formed to approximately the same curvature as that of said central portion of said mandrel and placing such mask over the photoresist, placing the assembled mandrel, photoresist, and mask in a vacuum chamber and evaporating a metallic coating of a first metal onto the photoresist through openings in the screen of the mask, removing the mask, exposing the photoresist coating to light, chemically removing the coating of said first metal, developing the photoresist to yield columns of photoresist material projecting upward from the mandrel in locations corresponding to the openings in the screen of the mask, depositing a second metal by electroforming technique in spaces between the upstanding columns of photoresist material thereby to form a screen of said second metal accurately shaped to the shape of the underlying portion of the mandrel, and removing said screen of said second metal from said mandrel for use as a portion of a lens electrode.

12. The invention defined in claim 11, wherein said first metal is aluminum and said second metal is copper.

13. The invention defined in claim 10, wherein the depositing of said second metal is performed not only in the area of previous deposit of said first metal coating through said mask but also in a surrounding area, to provide a surrounding area of deposit of said second metal in solid form as distinguished from screen form, the surrounding solid form part of the deposited second metal being electrically conductively continuous with and a smooth continuation of the screen form portion of the deposited second metal.

14. The invention defined in claim 11, comprising the further step of placing a thin continuous layer of conductive material over the screen formed by deposit of said second metal.

15. The invention defined in claim 14, wherein said layer of conductive material has a thickness in the range of about 50 to 100 Angstroms.

16. The invention defined in claim 14, wherein said layer of conductive material is a layer of carbon placed by evaporating carbon onto said screen in a vacuum chamber.

17. The method of determining the optimum shape of a curved surface of an electrode for use in a charged particle lens, to reduce spherical aberration in such lens, which comprises the steps of assuming a set of parameters for the lens including picking a trial set of potential expansion coefficients, calculating the electrostatic potential using the picked expansion coefficients, calculating a small angle trajectory for a charged particle to determine the point of intersection of trajectory of the charged particle with the optical axis of the lens, changing the picked expansion coefficients and recalculating the electrostatic potential if necessary until said point of intersection is at a desired point on the optical axis, picking a set of trajectory angles and calculating the spherical aberration function of the lens for each such angle, obtaining the sum of the squares of the spherical aberration functions calculated for the various angles, making slight changes in the expansion coefficients and recalculating the spherical aberration function of the lens for the same angles previously used and obtaining the sum of the squares of the recalculated spherical aberration functions, and continuing the slight change and recalculation process until a reasonable minimum value of the sum of the squares is reached.

18. The invention defined in claim 17, wherein the picked expansion coefficients are $\{A_n, B_{in}, z_{in}\}$ and the electrostatic potential is calculated by using the following equation $$\phi(\rho,z) = \sum_{n=0}^{\infty} \left\{ A_n(\rho^2 + z^2)^{n/2} P_n\left(\frac{z}{\sqrt{\rho^2 + z^2}}\right) + \sum_{i=1}^{N_n} B_{in}[\rho^2 + (z - z_{in})^2]^{-(n+1)/2} P_n\left(\frac{z - z_{in}}{\sqrt{\rho^2 + (z - z_{in})^2}}\right)\right\}, \quad (7)$$

in which the various letters and symbols have the meanings explained in the foregoing specification or well understood by mathematicians.

* * * * *

UNITED STATES PATENT AND TRADEMARK OFFICE
CERTIFICATE OF CORRECTION

PATENT NO. : 4,330,708                    Page 1 of 2
DATED     : May 18, 1982
INVENTOR(S) : William D. Meisburger It is certified that error appears in the above-identified patent and that said Letters Patent is hereby corrected as shown below:

Column 4, line 2 should read -- $\nabla^2 \phi = 0.$      (4)--.
Column 4, line 61, "$\pi$" should read -- $\rho$ --.
Column 5, line 6, equation (8) should read -- $\phi(\rho,z) = \phi(0,z_L)$, --.

Column 5, line 8, equation (9) should read -- $\phi(\rho,z) = \phi(0,z_R).$ --.

Column 5, line 57, "$\pi$" should read -- $\rho$ --; line 59, "$\pi$" should read -- $\rho$ --; line 62, "$\pi$" should read -- $\rho$ --; line 67, "$\pi$" should read -- $\rho$ --. Column 6, line 7, "$\pi$" should read -- $\rho$ --; line 10, equation (14) should read -- $\phi(\rho(z),z) - \phi(0,z_L) = f(z) = 0$, --;

line 13, equation (15) should read -- $\rho(z) = \mathrm{Tan}\,(\alpha)\,[z-z_0].$ --;

line 18, equation (16) should read -- $E = E_{KI} + q\phi(0,z_L).$ --;

line 24, at the end of the line insert --(17)--; line 28, "$\pi$" should read -- $\rho$ --; line 31, equation (18) should read -- $\phi(\rho(z),z) - \phi(0,z_R) = f(z) = 0$, --;

line 33, "$\pi$" should read -- $\rho$ --.

UNITED STATES PATENT AND TRADEMARK OFFICE
CERTIFICATE OF CORRECTION

PATENT NO. : 4,330,708

DATED : May 18, 1982

INVENTOR(S) : William D. Meisburger

It is certified that error appears in the above-identified patent and that said Letters Patent is hereby corrected as shown below:

Column 7, line 40 "$\pi$" should read -- $\rho$ --.
Column 9, line 51, delete the parenthesis between the word "spacer" and the numeral "2"; line 56, "$\pi$" should read -- $\rho$ --.
Column 11, line 36, in equation (23), "$\pi$" should read -- $\rho$ --; line 40, "$\pi$" should read -- $\rho$ --.

Signed and Sealed this

Twenty-ninth Day of October 1985

[SEAL]

Attest:

Attesting Officer

DONALD J. QUIGG

Commissioner of Patents and Trademarks—Designate